(12) United States Patent
Avval et al.

(10) Patent No.: US 12,745,639 B2
(45) Date of Patent: Sep. 22, 2026

(54) APPARATUS AND METHOD TO REDUCE THE THERMAL RESISTANCE OF SEMICONDUCTOR SUBSTRATES

(71) Applicant: BOARD OF TRUSTEES OF THE UNIVERSITY OF ARKANSAS, Fayetteville, AR (US)

(72) Inventors: Amirreza Ghadimi Avval, Fayetteville, AR (US); Samir El-Ghazaly, Fayetteville, AR (US); Gregory J. Salamo, Fayetteville, AR (US); Shui-Qing Yu, Fayetteville, AR (US)

(73) Assignee: Board Of Trustees Of The University Of Arkansas, Little Rock, AR (US)

( * ) Notice: Subject to any disclaimer, the term of this patent is extended or adjusted under 35 U.S.C. 154(b) by 670 days.

(21) Appl. No.: 18/155,612

(22) Filed: Jan. 17, 2023

(65) Prior Publication Data

US 2023/0290707 A1 Sep. 14, 2023

Related U.S. Application Data

(63) Continuation-in-part of application No. 16/711,127, filed on Dec. 11, 2019, now abandoned.

(60) Provisional application No. 62/779,269, filed on Dec. 13, 2018.

(51) Int. Cl.

| | |
|---|---|
| ***H10W 40/77*** | (2026.01) |
| ***H10D 30/47*** | (2025.01) |
| ***H10D 62/10*** | (2025.01) |
| ***H10D 62/85*** | (2025.01) |
| ***H10W 40/22*** | (2026.01) |

(52) U.S. Cl.
CPC .......... *H10W 40/77* (2026.01); *H10D 30/475* (2025.01); *H10D 62/8503* (2025.01)

(58) Field of Classification Search
CPC ..... H01L 23/46; H01L 23/473; H01L 23/367; H01L 23/34; H01L 23/42; H01L 23/433; H10W 40/228; H10W 40/20; H10W 40/22; H10W 40/226; H10W 40/77; H10W 40/70; H10W 20/021
See application file for complete search history.

(56) References Cited

U.S. PATENT DOCUMENTS

| | | | |
|---|---|---|---|
| 5,172,301 | A | 12/1992 | Schneider |
| 8,860,210 | B2 | 10/2014 | Kakiuchi |
| 9,780,206 | B2 | 10/2017 | Cooper, Jr. |
| 2003/0131476 | A1 | 7/2003 | Ocher |
| 2004/0026779 | A1 | 2/2004 | Cai |
| 2005/0104134 | A1 | 5/2005 | Kato |

(Continued)

OTHER PUBLICATIONS

M. A. Alim et al., "Thermal characterisation of AlGaN/GaN HEMT on silicon carbide substrate for high frequency application," 2014 9th European Microwave Integrated Circuit Conference, Rome, 2014, pp. 210-213.

(Continued)

*Primary Examiner* — Antonio B Crite
(74) *Attorney, Agent, or Firm* — Keith A. Vogt; Keith Vogt, Ltd.

(57) ABSTRACT

A semiconductor heat sink made of a first material including a plurality of spaced-apart depressions and an area surrounding the depressions filled with one or more materials having a heat conductivity greater than the first material.

12 Claims, 4 Drawing Sheets

(56) References Cited

U.S. PATENT DOCUMENTS

| | | | | |
|---|---|---|---|---|
| 2006/0278901 | A1* | 12/2006 | Dangelo | H01L 23/373 257/E23.105 |
| 2007/0235847 | A1* | 10/2007 | Ramanathan | H01L 23/373 257/E23.105 |
| 2007/0246796 | A1 | 10/2007 | Guo | |
| 2010/0164093 | A1 | 7/2010 | Mowry | |
| 2012/0168206 | A1* | 7/2012 | Sekine | H01L 23/49827 174/266 |
| 2015/0084128 | A1* | 3/2015 | Gambino | H01L 23/34 438/584 |
| 2015/0292687 | A1 | 10/2015 | Sugiyama | |
| 2015/0295155 | A1 | 10/2015 | Shur | |
| 2015/0311137 | A1 | 10/2015 | Oganesian | |
| 2018/0025962 | A1 | 1/2018 | Dede | |
| 2020/0036159 | A1 | 1/2020 | Wolf | |
| 2020/0168523 | A1 | 5/2020 | Huang | |

OTHER PUBLICATIONS

F. Cappelluti, M. Furno, A. Angelini, F. Bonani, M. Pirola and G. Ghione, “On the Substrate Thermal Optimization in SiC-Based Backside-Mounted High-Power GaN FETs,” in IEEE Transactions on Electron Devices, vol. 54, No. 7, pp. 1744-1752, Jul. 2007.

A. Prejs, S. Wood, R. Pengelly and W. Pribble, “Thermal analysis and its application to high power GaN HEMT amplifiers,” 2009 IEEE MTT-S International Microwave Symposium Digest, Boston, MA, 2009, pp. 917-920.

M. Balakrishnan, “Evaluation of Thermal Management Solutions for Power Semiconductors,” Ph.D., The University of Sheffield, 2016.

K. R. Bagnall, “Device-level Thermal Analysis of GaN-based Electronics,” M.Sc., Massachusetts Institute of Technology, 2013.

* cited by examiner

APPARATUS AND METHOD TO REDUCE THE THERMAL RESISTANCE OF SEMICONDUCTOR SUBSTRATES

RELATED APPLICATIONS

This application is a continuation-in-part os U.S. Ser. No. 16/711,127 filed Dec. 11, 2019, which claims priority to Provisional Application Ser. No. 62/779,269 filed on Dec. 13, 2018, which is incorporated herein by reference.

STATEMENT REGARDING FEDERALLY SPONSORED RESEARCH & DEVELOPMENT

This invention was made with government support under contract No. US/NSF/1745143/Eager: Sapphire Based Integrated Microwave Photonics (0402 01998-21-0000). The government has certain rights in the invention.

BACKGROUND OF THE INVENTION

Any type of circuit component that has the ability to electrically control the electron flow is called a switch. The switch may depend on an active device in its operation. Some of these active devices allow a voltage to control the current flow through them while some devices do the job by another controlling current signal. In these types of switches, electricity is controlling electricity. These two categories of switches are commonly referred to as voltage-controlled devices and current-controlled devices, respectively. Vacuum tubes, transistors, and silicon-controlled rectifiers are examples of active devices. Initially, transistors were made as current-controlled devices, but voltage-controlled transistors were also developed thereafter.

Different terms are used for these transistors, such as bipolar junction transistor (BJT), field-effect transistor (FET), metal-oxide-semiconductor and metal-semiconductor FET, heterojunction bipolar transistor (HBT), and high electron mobility transistor (HEMT). The terms mark the structural configuration and physical mechanisms associated with these devices, which demonstrate the fundamental settings for the operation. These devices are often developed for high-speed applications and low-noise or power operations such as small-signal amplifiers, power amplifiers, mixers, and oscillators operating over a wide frequency range. The other category of applications is the RF circuits and systems, where the devices are used in cellular communications and RADARs in an integrated circuit configuration.

The main solid-state materials for designing high-performance transistors and power amplifiers are Silicon, Gallium Arsenide, Silicon Germanium, Aluminum Gallium Nitride, Silicon Carbide, and Gallium Nitride. These are used for the formation of channel layers, buffer layers, and substrates in most transistor devices. Devices and circuits that are based on silicon are the forerunners of all semiconductor devices. However, the recent upsurge in wireless applications, 5G technology, electric cars, solar cells, and power switches, demands high-frequency operations, high power handling, and high-temperature performance of the devices where silicon may not be able to fulfill the needs. This is one of the reasons for the recent focus of many research groups on some wide-bandgap semiconductors.

These devices are mainly characterized by the operating frequency, output power density, and power-added efficiency. However, for a thorough characterization of semiconductor devices, the study of device operation over different temperature ranges is also very vital, especially for high-power devices such as GaN-based HEMTs, where a great amount of heat is generated which affects the underlying physics of the device. It is therefore very important to determine what the maximum channel temperature is under specific operating modes. Hence, other than the materials chosen for the active layers, deciding on the best option for the substrate is also very critical, as it serves as the layer where the generated heat in the channel layer is dissipated.

BRIEF SUMMARY OF THE INVENTION

In one embodiment, the present invention provides a method, system, approach, and solution that increases the thermal conductance of a power semiconductor device that generates heat in the channel layer which needs to be dissipated through the substrate.

In another embodiment, the present invention provides a method, system, approach, and solution that improves the power handling capabilities of a power semiconductor device.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure, or system. Further, the terms and phrases used herein are not intended to be limiting, but rather to provide an understandable description of the invention.

The electrical current flow through the channel layer of a power semiconductor device leads to the generation of a substantial amount of internal heat in an operating environment. The internally generated heat has to be removed properly. Otherwise, the temperature for the junction of the semiconductor device would rise to values that may result in degradation of the device operation or catastrophic damage to the active region. To maintain the junction temperature below the maximum allowed values for a semiconductor device, the substrate must have the ability to dissipate the heat by facilitating and enabling the heat flow away from the device.

Figure 1:
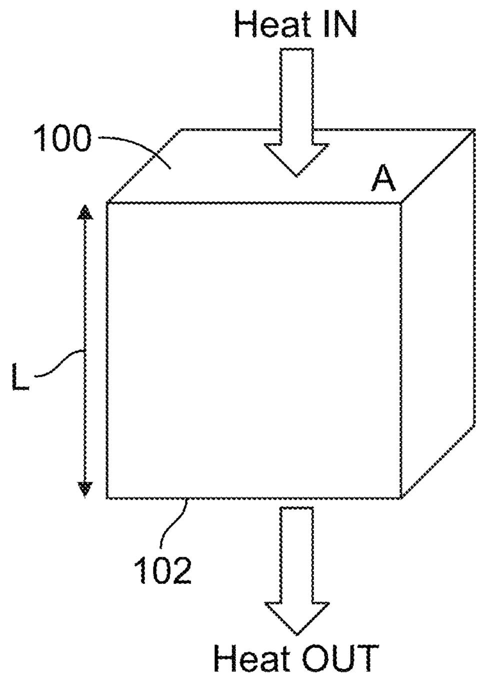
FIG. 1 illustrates conductive heat flow in an object.

The heat transfer model discussed herein is the conduction heat transfer which occurs due to temperature gradients in a body. As shown in FIG. 1, the conductive heat energy is transferred from a hot surface (Face 100) to a cold surface (Face 102). The temperature of the object mainly depends on the separation between the two faces and its thermal conductivity. Heat transfer rate by conduction through the object can be expressed as $$P = \frac{kA}{L}\Delta T,$$

where A is the cross-sectional area of the object, L is the distance between the two faces or the wall thickness, ΔT is the temperature difference between the two surfaces, and k is the thermal conductivity for the material in W/mK.

A parameter called the thermal resistance of the material is defined which depends upon the thermal conductivity of the material, material thickness, and object area. This parameter is represented based on the following equation. The resistance can be decreased by increasing the thermal conductivity of the material.

$$R_{conduction} = \frac{L}{kA}$$

Figure 2:
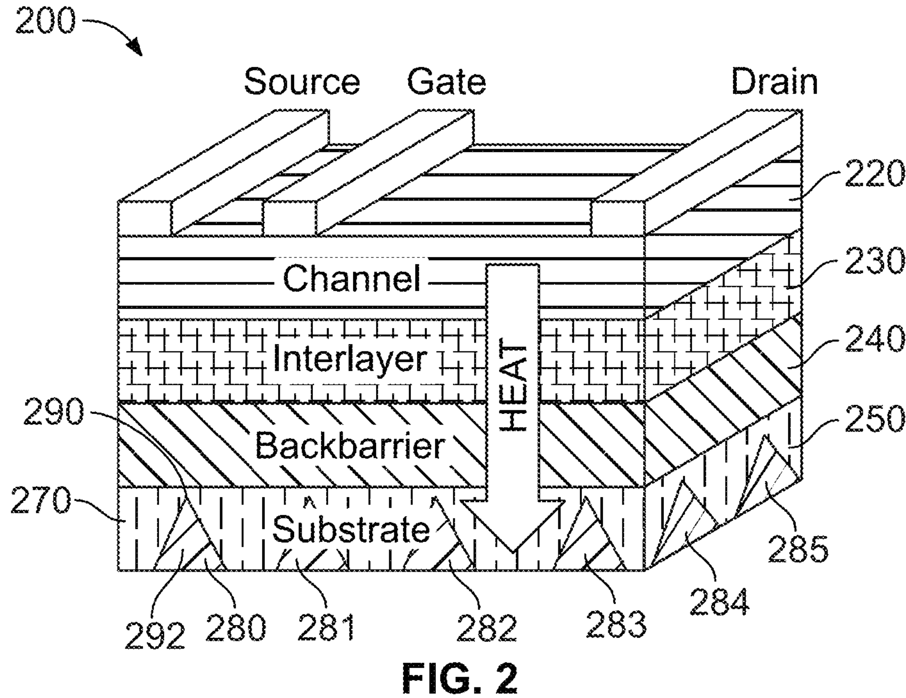
FIG. 2 illustrates a heat flow path in a GaN HEMT device.

Silicon, sapphire, and silicon carbide are examples of semiconductor substrates that are used in the fabrication of power devices. Most of these power devices have the functionality of amplification and thus a great amount of current flows through them. This current will lead to the generation of high-temperature gradients and the substrate must have the capability of dissipating this heat either to the metallization on the backside or any heat sink mounted on the device. FIG. 2 shows an example of the path for the heat flow in a HEMT device 200. As shown, heat flows from channel 220 into substrate 250, through interlayer 230 and back-barrier 240.

Power handling capabilities of silicon range from 10 to $10^8$ VA and over a frequency range of 10 Hz to 1 MHz. Some examples of the applications are the AC motor drives for locomotives and hybrid cars and providing switching power supplies for industrial applications. To study the heat dissipation capabilities of this substrate, a simulation was conducted in COMSOL Multiphysics.

Figure 3:
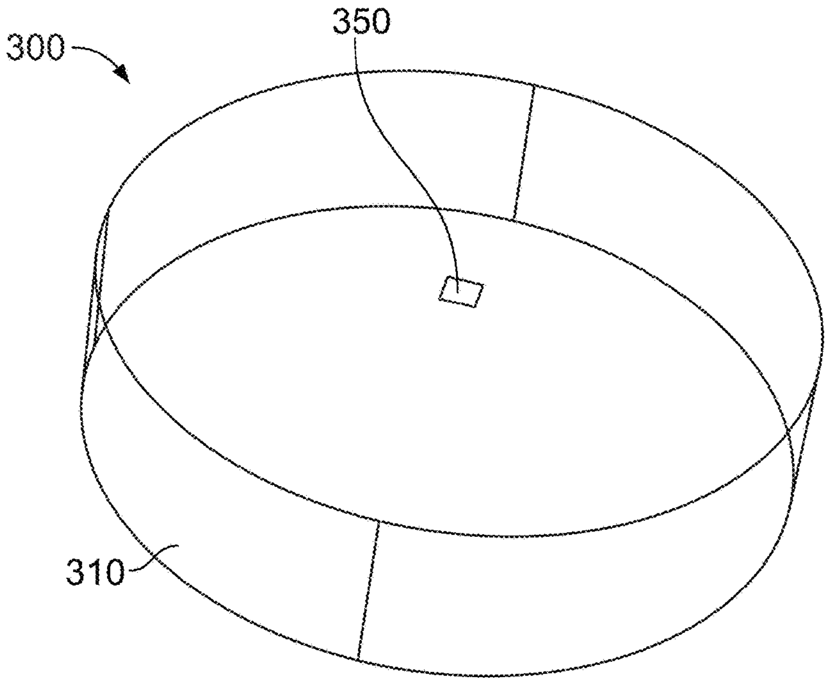
FIG. 3 is a substrate simulation in COMSOL (silicon thickness=500 μm) for an embodiment of the present invention.

FIG. 3 shows a substrate 300 for solid-state amplifiers. This is simulated in a cylinder-shaped configuration and it was assumed that this is made of silicon with a thickness of 500 μm. This substrate is metalized on the back using copper. In a preferred embodiment, lower face 310 is coated with a very thin layer of copper. Table 1 shows the thermal properties of the two materials. The radius of the cross-section is 1000 μm and an area of 100 μm×100 μm is considered on top as section 350 where the electric power is applied. This small section indicates the region where the active device is grown on. Lower face 310 of the cylinder has a fixed temperature boundary condition at 293.15 K. For all the other faces a convective heat flux density boundary condition is defined.

Figure 4:
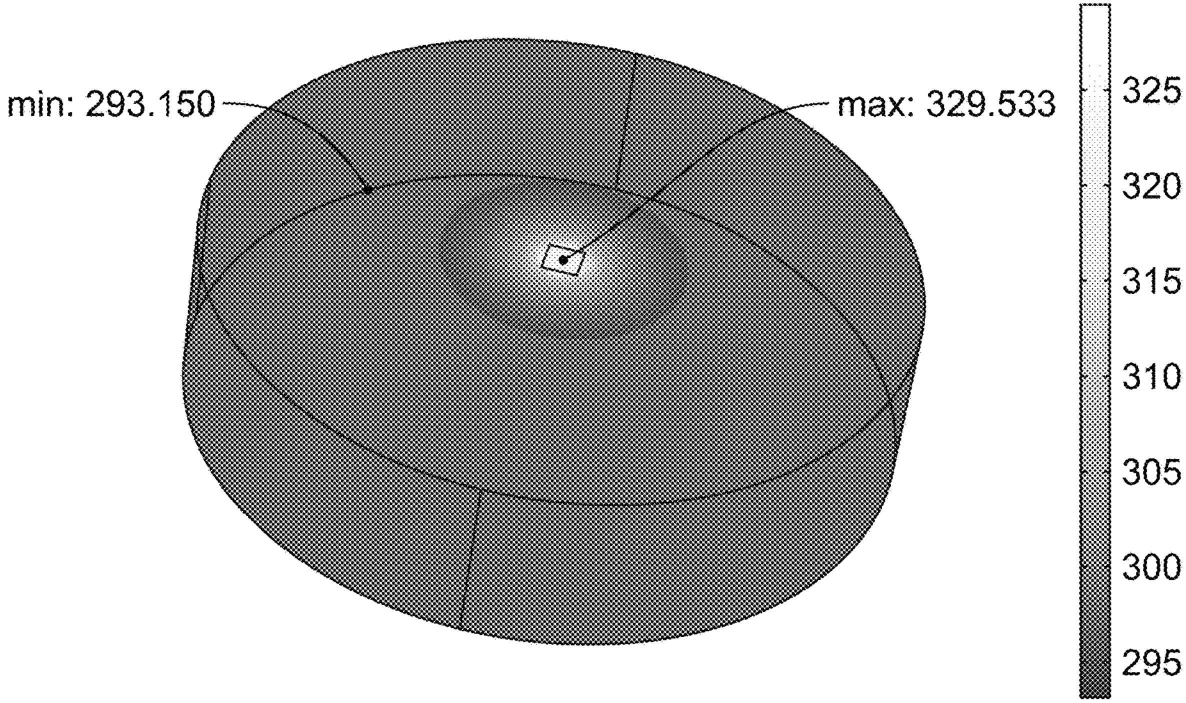
FIG. 4 illustrates heat distribution in a 500 μm silicon substrate (applied power=1 W) for an embodiment of the present invention.

Here, the heat dissipation capability of this substrate is simulated. One watt of power is applied to small section 350 on top and the temperature distribution results are obtained. FIG. 4 shows the heat distribution inside the substrate. As can be seen, the maximum temperature at point 350 where power is applied and the device is mounted is roughly 330 K. It is understood that applying a power of 1 W is not the practical case and this is assumed only for the sake of this simulation. However, as many substrates are incapable of dissipating the required heat in many devices, this has been a limitation for many research groups dealing with high-power circuits.

TABLE 1

Thermal properties of silicon and copper

| Material | Thermal Conductivity (W/m · K) | Density (Kg/m$^3$) | Heat Capacity (J/Kg · K) |
|---|---|---|---|
| Silicon | 148 | 2329 | 712 |
| Copper | 385 | 8940 | 385 |

As discussed earlier, increasing the heat conduction coefficient of an object will result in a reduction in the thermal resistance of the material. In one aspect, the embodiments of the present invention may start with a selective etching process on the substrate from the backside. The etching process of microfabrication may be defined as chemically removing layers from the surface of a wafer during manufacturing. Part of the wafer is protected from the etchant by a masking material that resists etching. According to the material being used as the substrate, different etching techniques might be used. In wet etching, the wafer is immersed in a bath of etchant, while in plasma etching, energetic free radicals are produced that react at the surface of the wafer.

There are two figures of merit for the etching process: selectivity which deals with the ability of the etchant to remove the top layer of a multilayer structure without damaging the masking or underlying layers and isotropy which defines the direction for the etching process. In a preferred embodiment of the present invention, as shown in FIG. 2, a semiconductor 200 comprising a substrate 250 made of a first material 270 is provided. Substrate 250 may also include a heat sink comprised of a plurality of spaced-apart truncated cones 280-285. Truncated cones 280-285 may be filled with one or more second materials having a heat conductivity greater than the first material 270. In other aspects, the second material may be comprised of a single material such as copper.

Figure 5:
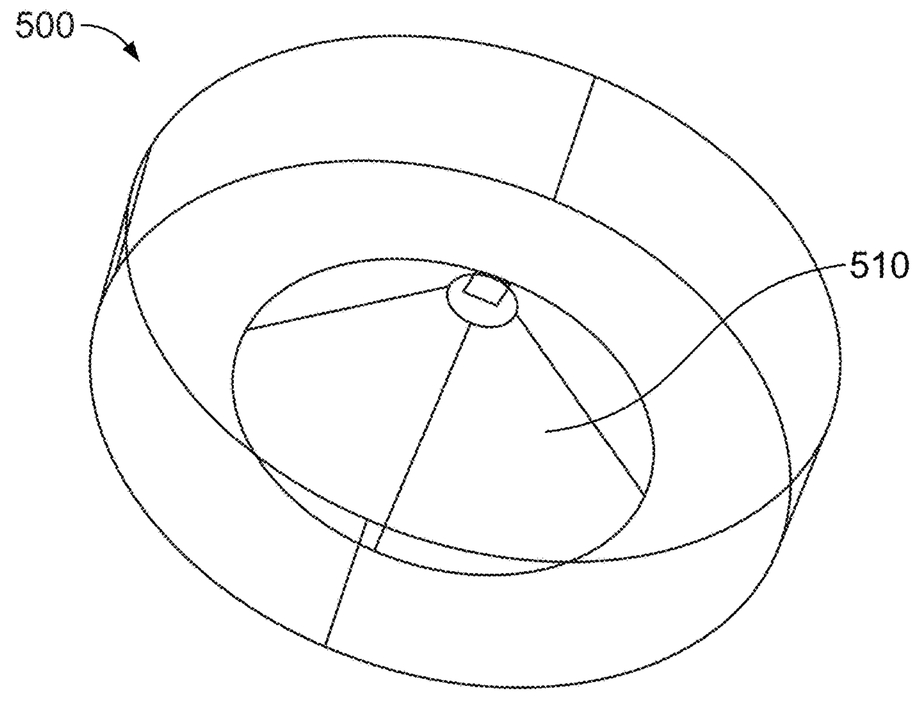
FIG. 5 illustrates a truncated cone shape etched into the silicon substrate for an embodiment of the present invention.

While FIG. 5 shows substrate 500 may be etched to form a truncated cone shape 510 therein, other shapes known to those of skill in the art may be used to form depressions consisting of etched-away material which may be filled with highly conductive materials. Such shapes include cylinders, circles, squares, and other shapes known to those of skill in the art. A truncated cone is preferred because it does not require a high figure of merit for the etching process and removing a shape with a slope like a truncated cone is pretty straightforward. In yet other embodiments, substrate 500 may be Silicon, Gallium Arsenide, Silicon Germanium, Aluminum Gallium Nitride, Silicon Carbide, and Gallium Nitride or combinations thereof.

As further shown in FIG. 2, the top radius for the cone 290 may be 100 μm, the bottom radius 292 may be 600 μm, and the height of the cone may be 450 μm. Top radius 290 is orientated towards channel 220, is opposingly located from bottom radius 292, and is located at the bottom of substrate 250. The mentioned dimensions are considered only for the sake of simulation and may change based on the application needed.

A consideration behind choosing a truncated cone shape as the etched section is dictated by the present etching technology and its methodologies. In other embodiments of the present invention, a cylinder shape as the etched section may be used but there are a couple of drawbacks associated with this configuration: 1) In order to have an etched section in the shape of a cylinder, a hole needs to be drilled in the back of the substrate and today's technology is not capable of drilling on robust substrates such as sapphire. Therefore, in this case, the embodiments of the present invention will lose their generality for all the substrate materials. 2) Even assuming that drilling a hole in the back of the substrate is practicable, the process of filling the etched section with a satisfactory conductor, which is normally done through sputtering, will not be feasible.

Robustness is one of the characteristics of the general substrates and platforms used in high-frequency devices and this feature is very prominent for sapphire material. However, when considering the case of etching a 500-micron substrate up to 490 μmicrons, the section with a thickness of 10 μmicrons will not have enough mechanical strength and may easily break during the etching process. In this case, having a truncated cone shape will provide sufficient mechanical support on the sides which prevents this breakage.

Etching a truncated cone is based on the etching process itself. If it is assumed that a chemical etching is applied on the back of the substrate (which is applicable for all materials), even if the process starts on a section with a fairly small diameter, it will eventually end up in a larger diameter. The reason is that in the process of chemical etching the chemical material not only etches deep inside the substrate but also will have some effects on the sides and this is similar to a case when a stone is dropped in water and the ripples are created. Consequently, at every level of etching, a small section from the sides of the target area will also be affected by this process. The deeper one etches inside the substrate, the larger the effect of this phenomenon will be on the sides. Eventually, the shape of the etched volume will look like a truncated cone.

The next stage is to fill the etched section with a combination of conducting materials (i.e., multiple layers of different materials) that possesses a high heat conductivity. This is done by either electroplating or another process known as sputtering. In the latter process, a gaseous plasma is created and then the ions from this plasma are accelerated into the target material. The idea of choosing the etched section similar to a truncated cone shape will have additional advantages during the sputtering stage. For simplicity, copper is used as an example. Filling the backside of the substrate with copper will also produce additional mechanical strength and increase the robustness of the wafer. The same simulation is then conducted with the new configuration and the power of 1 W is applied to the section on top.

Figure 6:
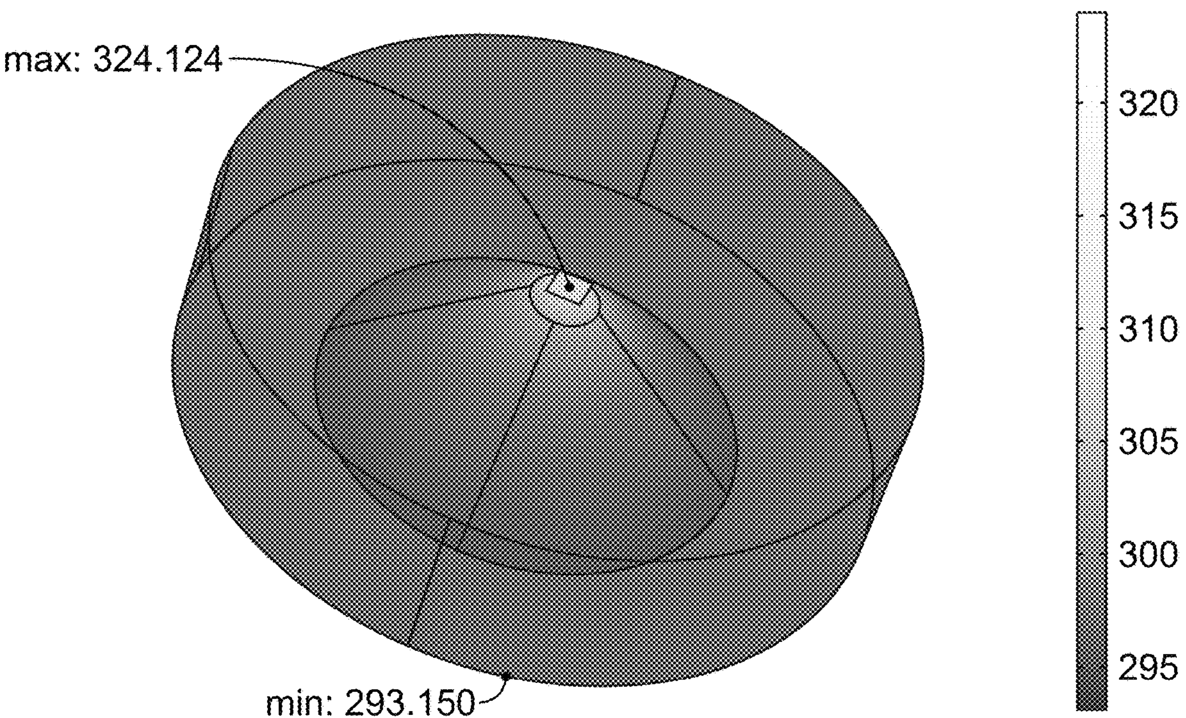
FIG. 6 illustrates heat flow in a 500 μm silicon substrate etched on the backside (applied power=1 W) for an embodiment of the present invention.

As shown in FIG. 6, the maximum temperature on top of the shape has been reduced to 324 K. A 20% reduction in the temperature difference between the ambient temperature and the maximum temperature is obtained with the new configuration. The results of the simulation for different applied power values are shown in Table 2. A consistent reduction in temperature difference is observed in all cases.

The simulations are continued with different dimensions for the truncated cone and it was concluded that the height of the cone is very vital in determining the maximum obtained temperature. Table 3 shows the simulation results for taller cone shapes etched into the silicon substrate. The other dimensions are the same as the previous case and the applied power is 5 W.

TABLE 2

Simulation results for different applied power values for a silicon substrate

| Silicon substrate | Maximum temperature without etching (T = 0.5 mm) | Maximum temperature with etching (T = 0.5 mm) | Reduction in temperature difference |
|---|---|---|---|
| Power = 1 W | 330 | 324 | 20% |
| Power = 2 W | 366 | 355 | 18% |
| Power = 3 W | 402 | 386 | 18% |
| Power = 4 W | 439 | 417 | 18% |
| Power = 5 W | 475 | 448 | 18% |

This reduction of the maximum temperature will eliminate the limitations in a large number of power devices, where the generated heat cannot be more than a certain value. The same process can be done on different substrates with different thermal conductivities and the temperature reduction in these substrates is prominent as well. Based on the application, substrate material, substrate thickness, and wafer dimensions may be adjusted.

TABLE 3

Results for different cone heights (applied power = 5 W)

| Silicon substrate | Maximum temperature with etching (T = 0.5 mm) | Reduction in temperature difference |
|---|---|---|
| Cone height = 460 μm | 441 | 23% |
| Cone height = 470 μm | 430 | 33% |
| Cone height = 480 μm | 416 | 48% |
| Cone height = 490 μm | 395 | 78% |

The same simulation for two different substrate materials was conducted as well. Sapphire is utilized in a special technology called Integrated Microwave Photonics (IMWP) which incorporates microwave and photonics functions on a single chip. SiC is also a reliable substrate for many RF amplifiers working in a frequency range of 30-100 GHz. Due to the fact that the thermal conductivity of SiC is much higher than sapphire, this substrate material is mostly used in high-power, high-frequency operations. Table 4 shows the same simulation conducted with these substrate materials. The applied power for all cases is 5 W and the truncated cone for the case of etched substrates has a height of 490 μm. The high value for the temperature reduction shows that the procedure provides consistent results for these cases as well.

TABLE 4

Simulation results for different substrate materials for a cone height of 490 μm (P = 5 W)

| Material | Maximum temperature without etching (T = 0.5 mm) | Maximum temperature with etching (T = 0.5 mm) | Reduction in temperature difference |
|---|---|---|---|
| Sapphire | 1362 | 569 | 288% |
| SiC | 518 | 405 | 101% |

Figure 7:
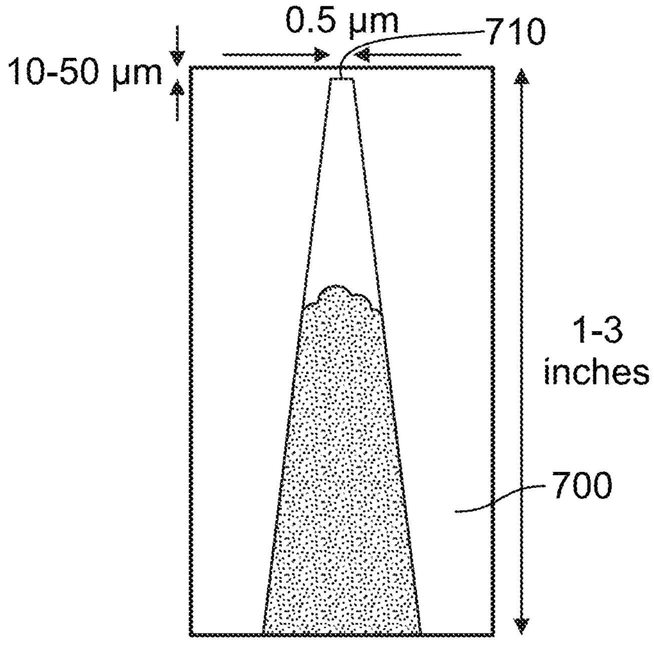
FIGS. 7 and 8 show a front-view schematic of a cut in the middle of the cylinder-shaped substrate which is etched from the back side.

As already stated, the proposed method is mainly developed as a thermal management technique for RF transistors. Compared to the lower frequency transistors, RF transistors operate at much faster speeds and are generally very small in dimension (around 1-2 μm in length). As already stated and demonstrated in FIG. 2, the hot region in these transistors is predominantly in the vicinity of the gate electrode and, hence, in practical cases, the dimension (length) of this region will be even smaller (around 0.5 μm). To ensure that a sufficient amount of substrate is maintained for electrical operability purposes and the generated heat is appropriately dissipated, the diameter of the top surface (smaller circle) of the etched truncated cone must be in the same range (around 0.5 μm). Despite the recent advancements in sputtering techniques, filling the etched section which may be a very tall cone or cylinder, where the height is much larger than the radius, will not be feasible. In other words, the reliability factor for ensuring that the etched section is completely filled with the material with high heat conductivity is significantly low and the filling 700 material may not touch the hot region 710 as demonstrated in FIGS. 7 and 8. A front-view schematic of a cut in the middle of the cylinder-shaped substrate which is etched from the back side is shown in this figure. The figure is not drawn to scale and the dimensions are mentioned as examples and are not limiting.

Figure 8:
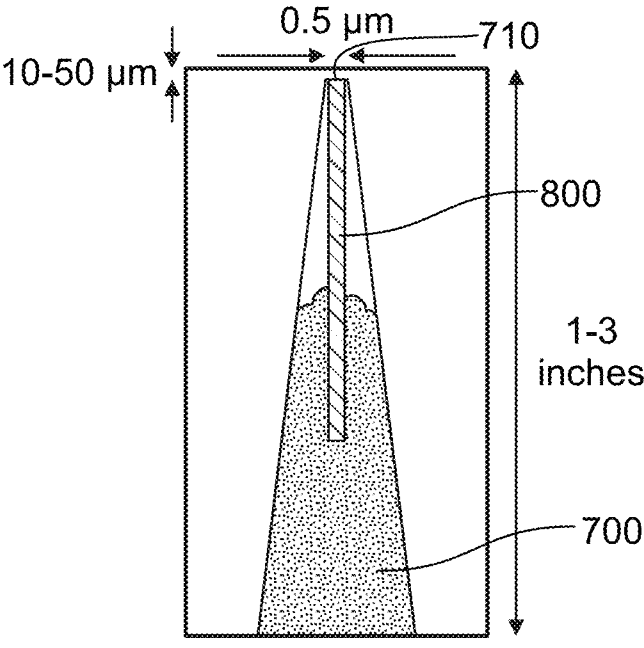

The solution to this problem is to utilize diamond rods or carbon nanotubes. Due to low phonon scattering and strong covalent bonding, natural diamond has a thermal conductivity of 2200 W/mK which is around five times more than the most thermally-conductive metals. This number for a monocrystalline synthetic diamond is around 3300 W/mK. Additionally, diamond is a good electrical insulator which makes it an ideal solution where the electrical conductivity of the heat-dissipating material cannot be tolerated. FIG. 8 illustrates the configuration where a heat-conducting member such as a diamond rod 800 is placed inside the etched section touching the hot region. This will ease the limitations of the filling process by conducting the heat through the diamond rod to the filling material and then to the backside metallization or any other heat sink on the backside of the substrate. The rod may also extend to reach the backside of the substrate which will directly assist with the thermal dissipation process of the filling material. Carbon nanotubes are also considered good thermal conductors along the tube axis with a room temperature thermal conductivity of 3500 W/mK for a single-walled tube. In the proposed technique, to entirely cover the area of the hot region, multi-walled carbon nanotubes needs to be utilized which will eventually have a cylindrical shape. Heat-conducting member 800 may also be a carbon nanotube.

Other than the high-power and high-frequency transistors, solar cells will also greatly benefit from the proposed approach. The two main goals of improving solar cells are reducing manufacturing costs and increasing power conversion efficiency. The most commonly used material for fabricating solar cells is crystalline silicon, which is capable of yielding roughly 30% conversion efficiency in solar panels. The remaining energy is typically converted to internal heat and as the solar cell sizes are decreasing, this heat is considered a bottleneck in conversion efficiency. The preferred embodiments of the present invention provide designs and structures that dissipate the internally generated heat, which prevents cell degradation and increases the efficiency of the panels. The technology may also extend to a complete elimination or at least a reduction in the need for complicated cooling systems when fabricating panels for solar cells.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A semiconductor comprising:

a heat producing active layer having electric circuitry that produces heat;

a substrate having a heat sink, said heat sink made of a first material, said heat sink including a plurality of spaced-apart depressions;

an area surrounding said depressions wherein said depressions are filled with one or more materials having a heat conductivity greater than said first material;

and a plurality of heat-conducting members located in said depressions towards said heat producing active layer until terminating in said heat producing active layer, said heat-conducting members extend out of said depressions.

2. The semiconductor of claim 1 wherein one or more of said heat-conducting members is a diamond rod.

3. The semiconductor of claim 1 wherein one or more of said heat-conducting members is a carbon nanotube.

4. The semiconductor of claim 1 wherein one or more of said heat-conducting members is a cylindrical carbon nanotube.

5. The semiconductor of claim 1 wherein said spaced-apart depressions are spaced apart truncated cones having therein at least one of said heat-conducting members and said heat-conducting members extend out of said truncated cones.

6. The semiconductor of claim 5 wherein said heat-conducting members extend out of said truncated cones towards said heat producing active layer until terminating in said heat producing active layer.

7. The semiconductor of claim 6 wherein one or more of said heat-conducting members is a diamond rod.

8. The semiconductor of claim 6 wherein one or more of said heat-conducting members is a carbon nanotube.

9. The semiconductor of claim 6 wherein one or more of said heat-conducting members is a cylindrical carbon nanotube.

10. The semiconductor of claim 6 wherein one or more of said spaced-apart truncated cones are made of at least one material that increases the mechanical strength of the said substrate.

11. The semiconductor of claim 6 wherein said spaced-apart truncated cones include a top radius and a bottom radius, said top radius spaced apart from said bottom radius, and heat conduction flows from said top radius to said bottom radius.

12. The semiconductor of claim 6 wherein said spaced-apart truncated cones include a top radius and a bottom radius, said top radius spaced apart from said bottom radius, and said top radius having a higher temperature than said bottom radius when heat is conducted through the said heat sink.

* * * * *